United States Patent
Kiyota

(10) Patent No.: US 10,326,262 B2
(45) Date of Patent: Jun. 18, 2019

(54) ELECTRICAL CONNECTION BOX

(71) Applicant: Yazaki Corporation, Tokyo (JP)

(72) Inventor: Hirotaka Kiyota, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/943,774

(22) Filed: Apr. 3, 2018

(65) Prior Publication Data
US 2018/0342859 A1 Nov. 29, 2018

(30) Foreign Application Priority Data
May 23, 2017 (JP) .................. 2017-102026

(51) Int. Cl.
| | |
|---|---|
| B60R 16/023 | (2006.01) |
| H05K 7/02 | (2006.01) |
| H05K 5/06 | (2006.01) |
| H02G 3/08 | (2006.01) |
| H02G 3/14 | (2006.01) |

(52) U.S. Cl.
CPC ......... *H02G 3/088* (2013.01); *B60R 16/0238* (2013.01); *B60R 16/0239* (2013.01); *H02G 3/14* (2013.01); *H05K 5/06* (2013.01); *H05K 7/026* (2013.01)

(58) Field of Classification Search
CPC .................................................. B60R 16/0239
See application file for complete search history.

(56) References Cited

U.S. PATENT DOCUMENTS

| | | | | |
|---|---|---|---|---|
| 5,394,134 A | * | 2/1995 | Kurz | B60R 16/0239 337/327 |
| 6,052,283 A | * | 4/2000 | Kawakita | B60R 16/0239 361/695 |
| 9,114,762 B2 | * | 8/2015 | Takeuchi | H02G 3/088 |
| 2005/0045360 A1 | * | 3/2005 | Kiyota | H02G 3/088 174/68.3 |
| 2007/0049090 A1 | * | 3/2007 | Kaneko | B60R 16/0239 439/271 |
| 2007/0230143 A1 | * | 10/2007 | Inagaki | B60R 16/0239 361/752 |
| 2008/0053699 A1 | * | 3/2008 | Nakayama | B60R 16/0239 174/532 |
| 2014/0083733 A1 | * | 3/2014 | Kamigaichi | B60R 16/0239 174/50 |
| 2015/0092384 A1 | * | 4/2015 | Miyazaki | B60R 16/0239 361/807 |
| 2017/0163015 A1 | * | 6/2017 | Imaizumi | H02G 3/081 |

FOREIGN PATENT DOCUMENTS

JP 2014-082858 A 5/2014

* cited by examiner

*Primary Examiner* — Hung V Ngo
(74) *Attorney, Agent, or Firm* — Sughrue Mion, PLLC

(57) ABSTRACT

An electrical connection box includes a frame that has a tubular inner wall and a tubular outer wall surrounding the inner wall, and accommodates an electronic component inside the inner wall a lower cover that covers a lower edge of the outer wall and an inner cover that is disposed inside the lower cover and covers a lower edge of the inner wall.

16 Claims, 14 Drawing Sheets

ELECTRICAL CONNECTION BOX

CROSS-REFERENCE TO RELATED APPLICATION(S)

The present application claims priority to and incorporates by reference the entire contents of Japanese Patent Application No. 2017-102026 filed in Japan on May 23, 2017.

BACKGROUND OF THE INVENTION

1. Field of the Invention

The present invention relates to an electrical connection box.

2. Description of the Related Art

Electrical connection boxes that have waterproof structures have been conventionally available. Japanese Patent Application Laid-open No. 2014-82858 discloses a technique of an electrical connection box in which an inner lid covering an internal circuit is provided between a lid and the internal circuit, and the lid is fixed to a case in a detachable manner by locking a locking portion of the lid to an engagement portion provided on the inner lid in a detachable manner.

The conventional electrical connection box has still room for improving its waterproofness. For example, when water enters the electrical connection box from a lower portion thereof, electronic components are preferably protected from entered water.

SUMMARY OF THE INVENTION

An object of the present invention is to provide an electrical connection box that can protect electronic components from water entered from a lower portion of the electrical connection box.

In order to achieve the above mentioned object, an electrical connection box according to one aspect of the present invention includes a frame that includes a tubular inner wall and a tubular outer wall surrounding the inner wall, and accommodates an electronic component inside the inner wall, a lower cover that covers a lower edge of the outer wall, and an inner cover that is disposed inside the lower cover and covers a lower edge of the inner wall.

According to another aspect of the present invention, in the electrical connection box, an outer surface of the inner cover may be apart from an inner surface of the lower cover.

According to still another aspect of the present invention, in the electrical connection box, a size of a gap between the outer surface of the inner cover and the inner surface of the lower cover may be increased as going to a bottom wall of the lower cover.

According to still another aspect of the present invention, in the electrical connection box, the frame further may include a first half-cylindrical portion that is formed integrally with the inner wall and the outer wall, has a half-cylindrical shape, and projects outward from the outer wall, the inner cover may include a main body that covers the lower edge of the inner wall and a second half-cylindrical portion that has a half-cylindrical shape and projects outward from the main body, a cylindrical portion may be formed by the first half-cylindrical portion and the second half-cylindrical portion in a state where the main body covers the lower edge of the inner wall, and an electrical wire connected to the electronic component may be inserted into and passed through the cylindrical portion.

According to still another aspect of the present invention, in the electrical connection box, the main body may have a line-shaped rib provided on an outer surface of the main body, the rib may abut the lower edge of the inner wall, and the rib may be connected to the second half-cylindrical portion.

According to still another aspect of the present invention, in the electrical connection box, a sidewall of the lower cover may be inserted between the outer wall and the inner wall.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes in detail an embodiment of an electrical connection box according to the present invention with reference to the accompanying drawings. Note that the embodiment does not limit the invention. The constituent elements of the following embodiment include elements that the persons skilled in the art can easily assume or that are substantially the same as the elements known by those in the art.

Embodiment

The embodiment is described with reference to FIGS. 1 to 14. The embodiment relates to an electrical connection box.

Figure 1:
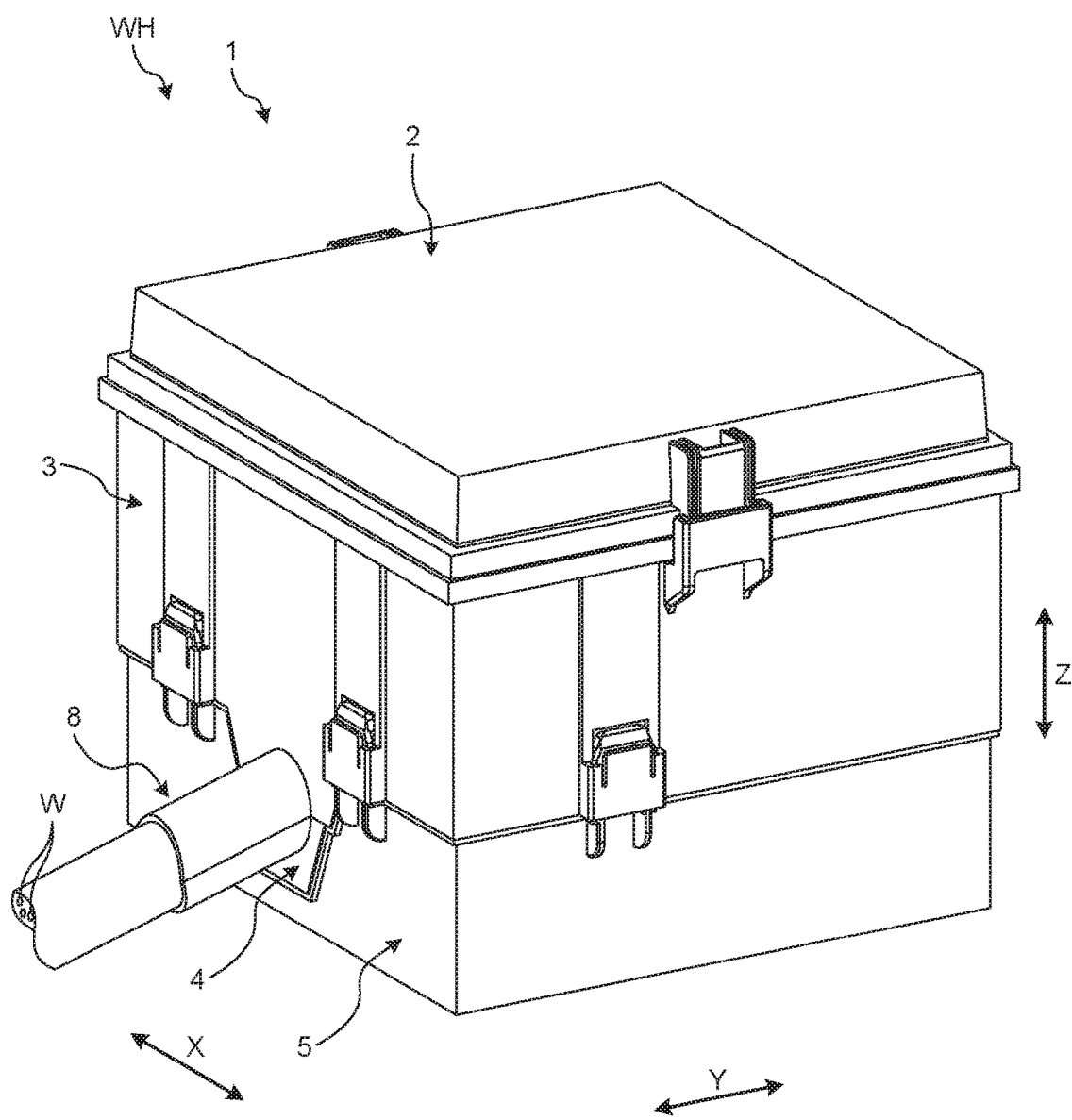
FIG. 1 is a perspective view of an electrical connection box according to an embodiment.
Figure 2:
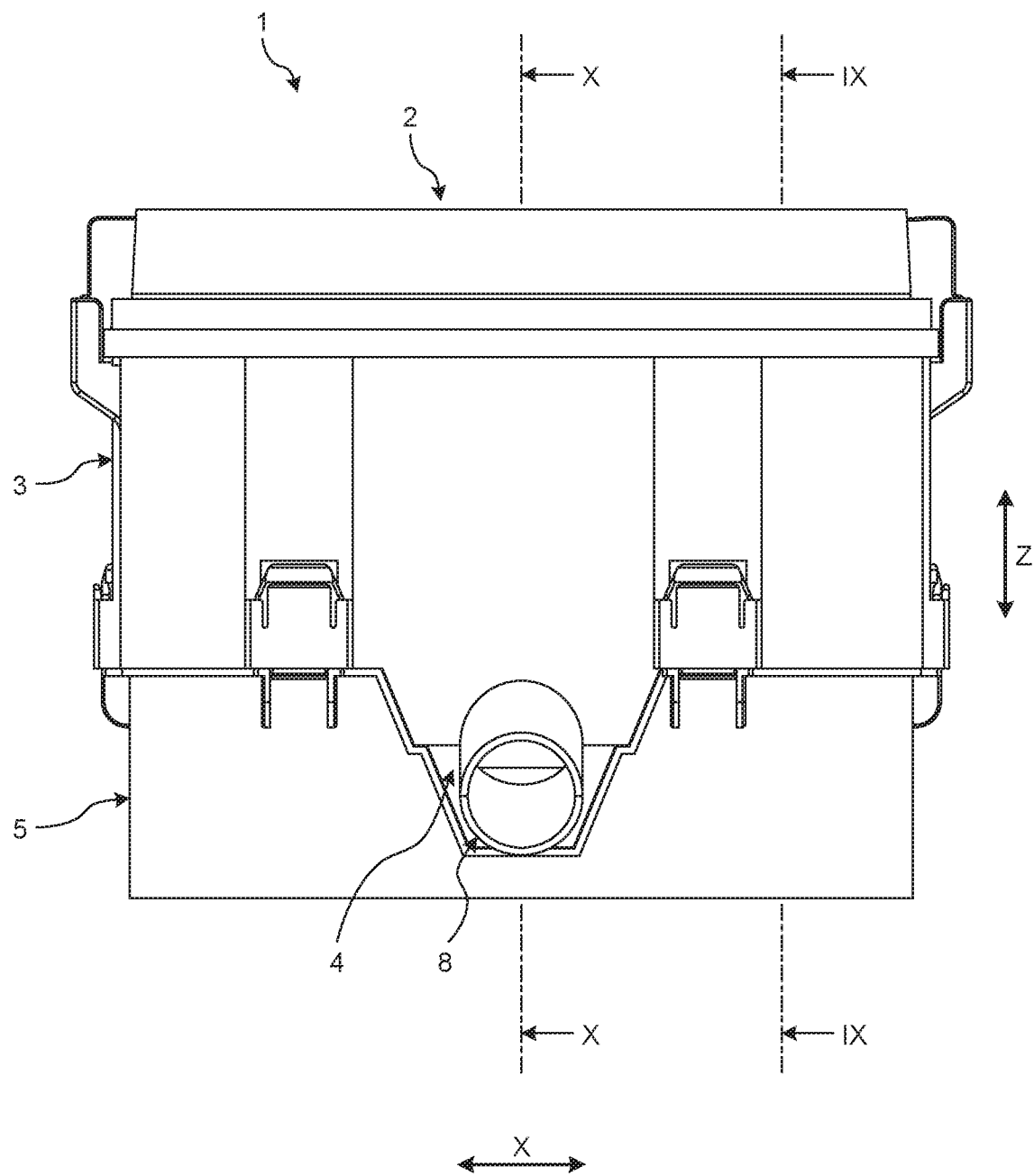
FIG. 2 is a front view of the electrical connection box according to the embodiment.
Figure 3:
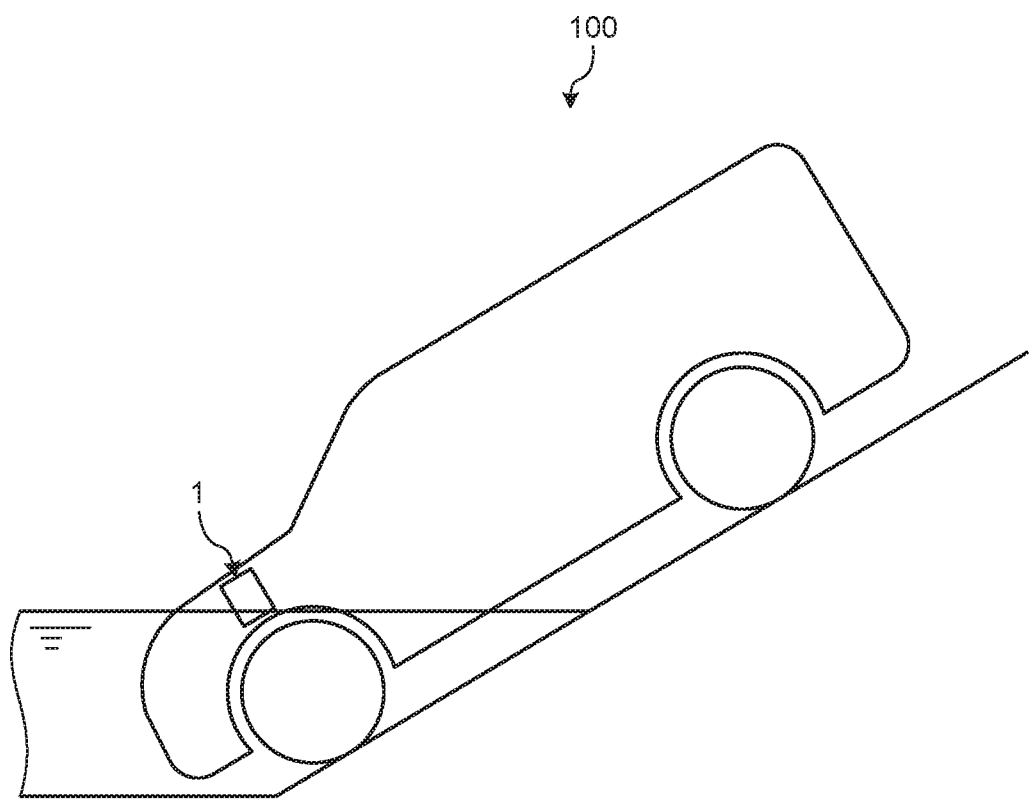
FIG. 3 is a schematic diagram illustrating an example of a mount position of the electrical connection box in a vehicle.
Figure 4:
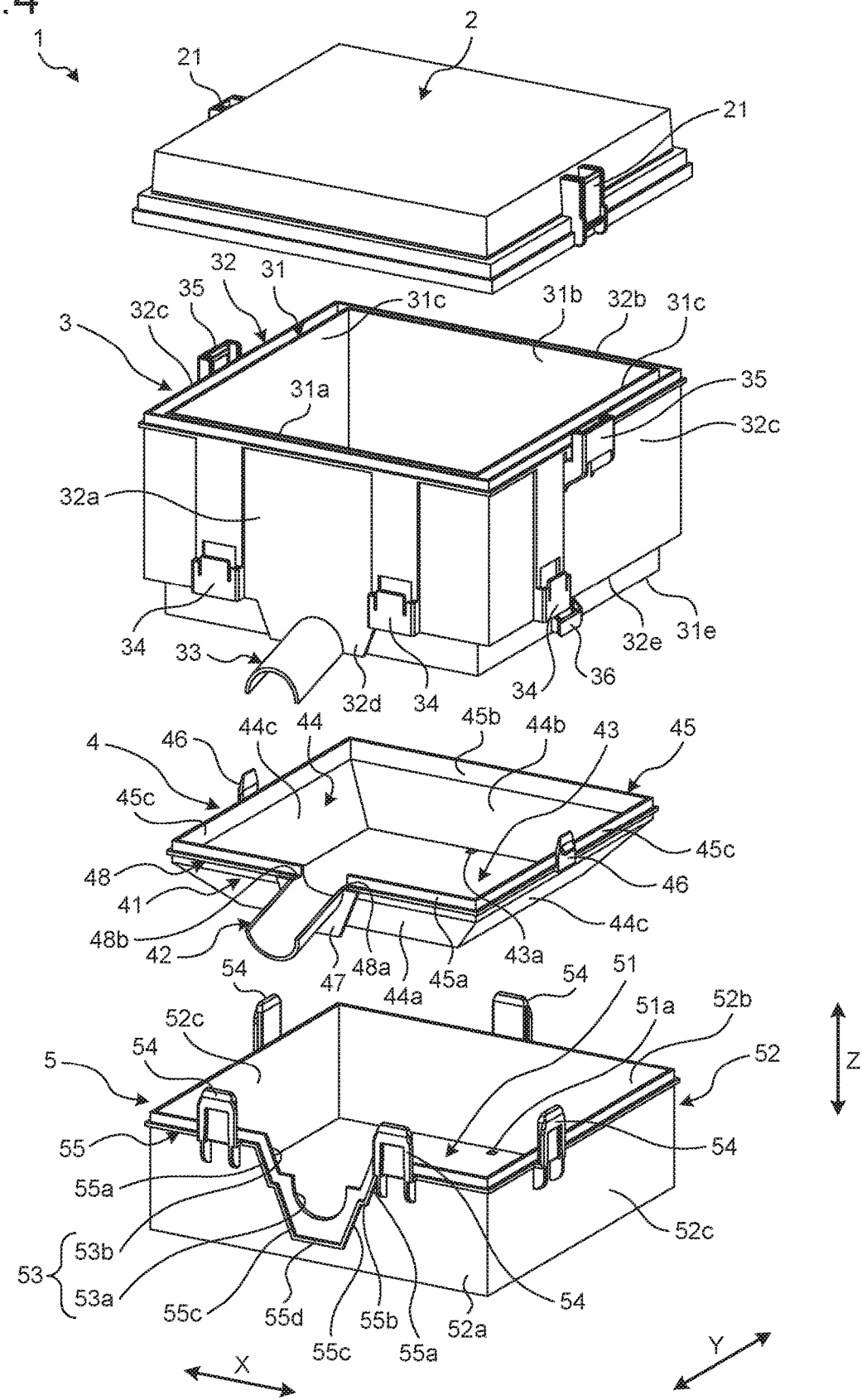
FIG. 4 is an exploded perspective view of the electrical connection box according to the embodiment.
Figure 5:
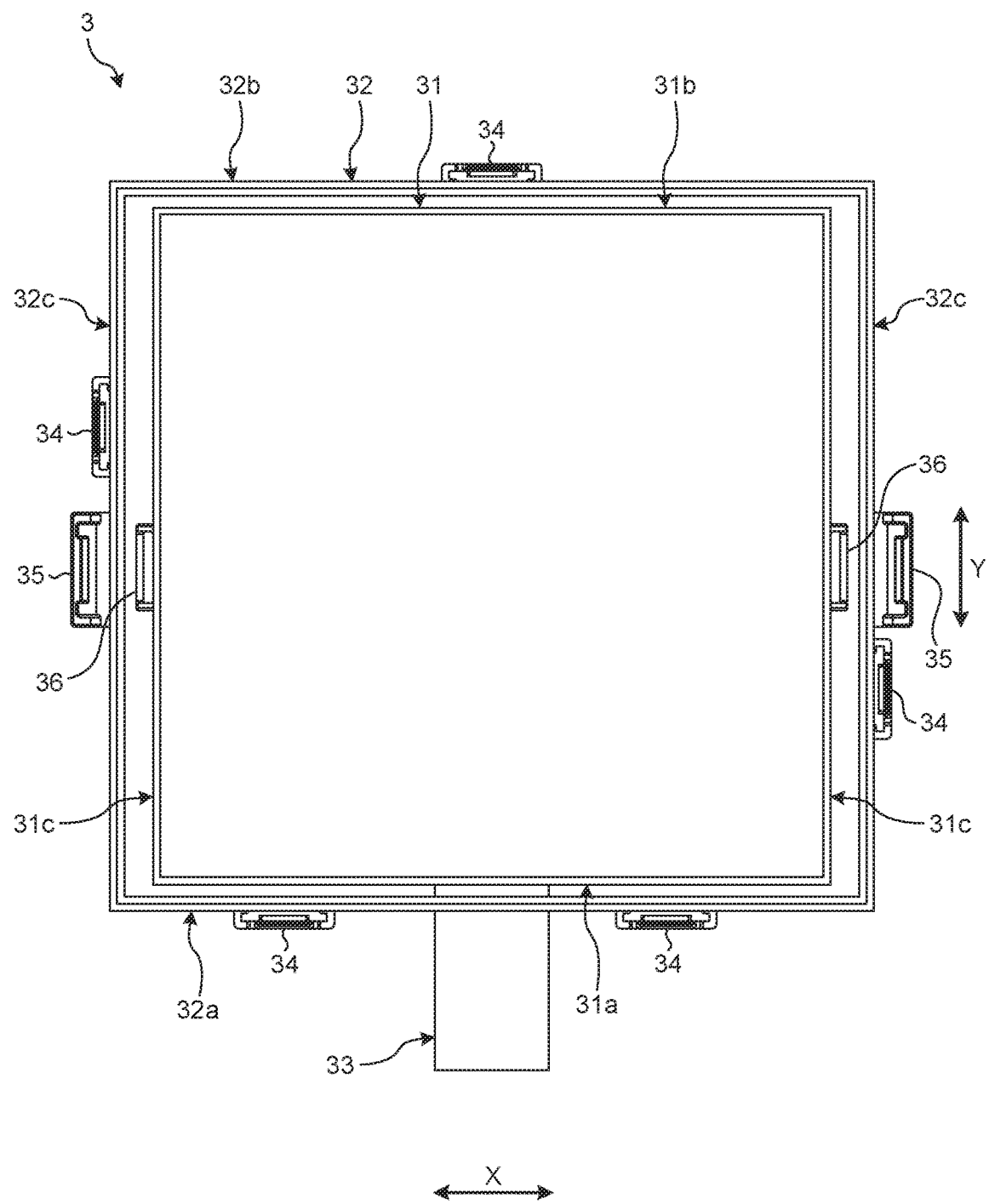
FIG. 5 is a plan view of a frame according to the embodiment.
Figure 6:
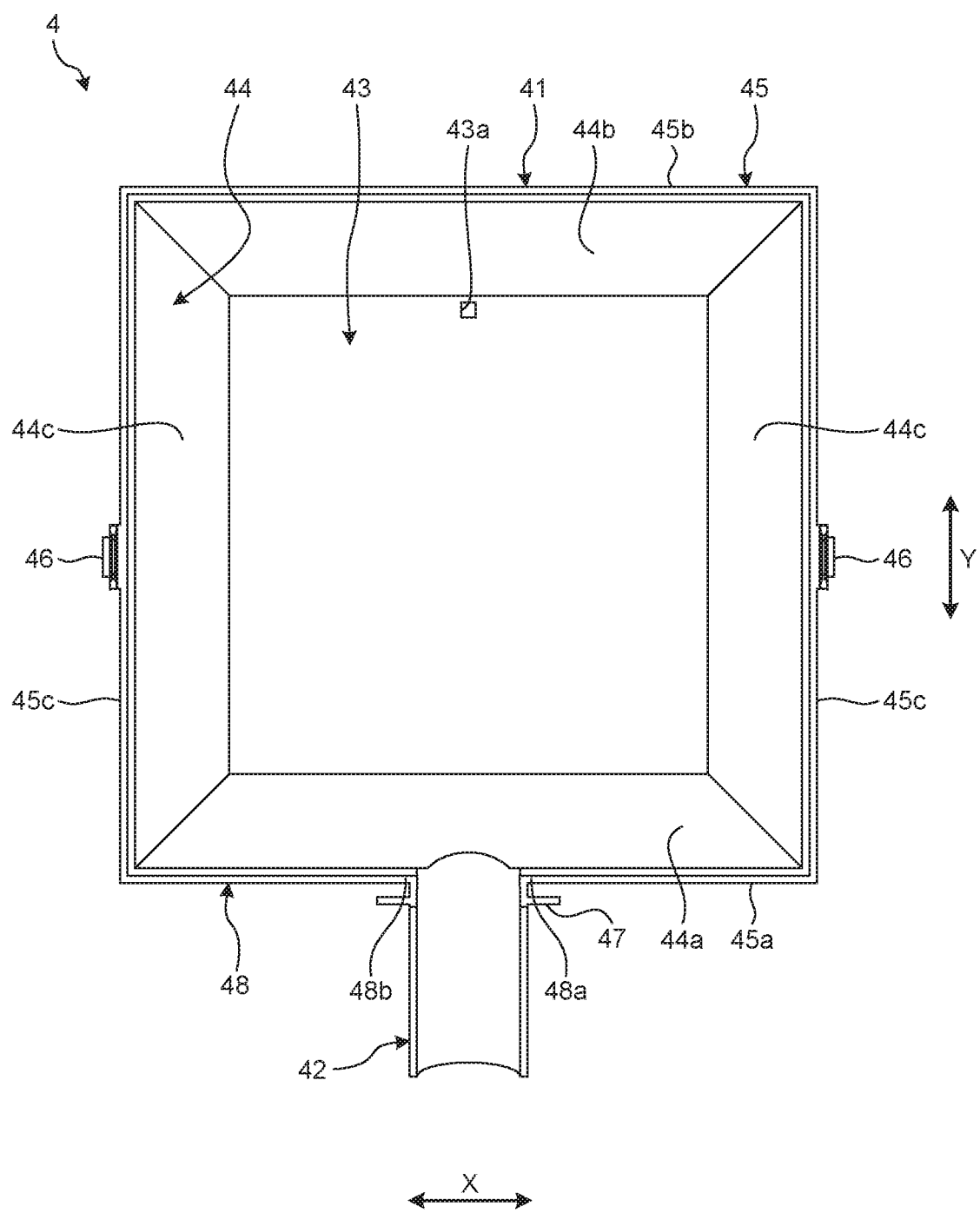
FIG. 6 is a plan view of an inner cover according to the embodiment.
Figure 7:
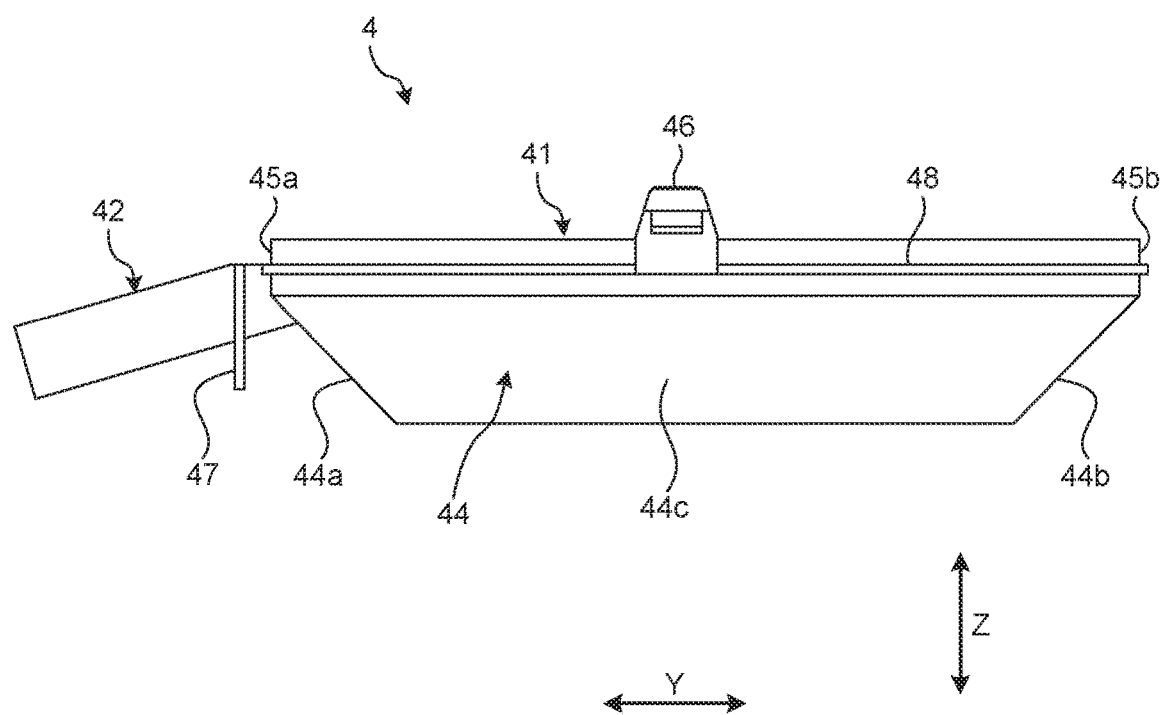
FIG. 7 is a side view of the inner cover according to the embodiment.
Figure 8:
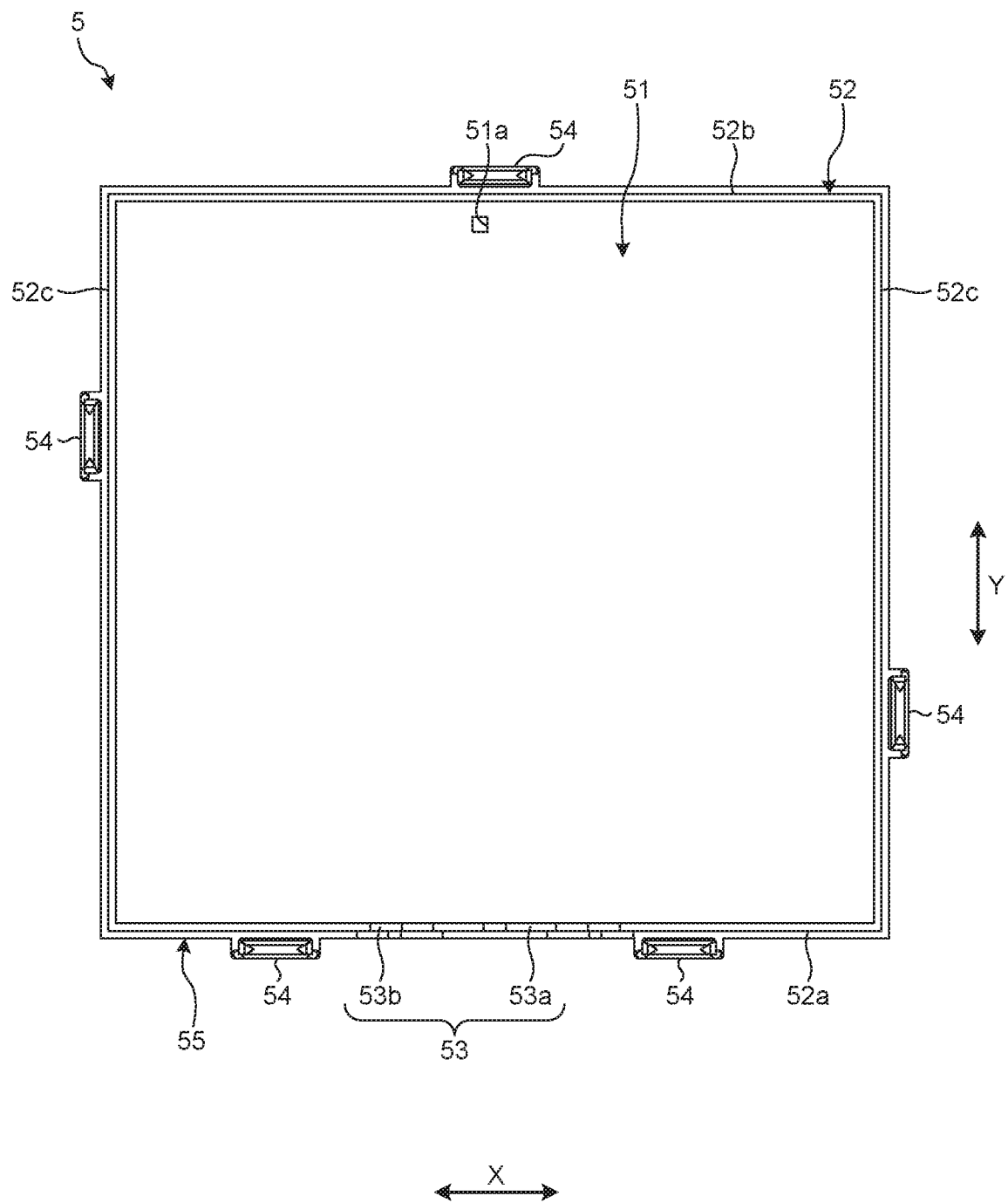
FIG. 8 is a plan view of a lower cover according to the embodiment.

FIG. 1 is a perspective view of the electrical connection box according to the embodiment. FIG. 2 is a front view of the electrical connection box according to the embodiment. FIG. 3 is a schematic diagram illustrating an example of a mount position of the electrical connection box in a vehicle. FIG. 4 is an exploded perspective view of the electrical connection box according to the embodiment. FIG. 5 is a plan view of a frame according to the embodiment. FIG. 6 is a plan view of an inner cover according to the embodiment. FIG. 7 is a side view of the inner cover according to the embodiment. FIG. 8 is a plan view of a lower cover according to the embodiment.

As illustrated in FIGS. 1 and 2, this electrical connection box 1 in the embodiment includes an upper cover 2, a frame 3, an inner cover 4, and a lower cover 5. The respective members of the electrical connection box 1 are formed of an insulating synthetic resin, for example. The electrical connection box 1 and electrical wires W form a wire harness WH. The wire harness WH, which is mounted on a vehicle such as an automobile, connects respective devices mounted on the vehicle. The wire harness WH has a plurality of electrical wires W used for power source supply and signal communication. For each of the electrical wires W, one end of the electrical wire W is connected to an electronic component accommodated in the electrical connection box 1, and the other end of the electrical wire W is connected to a corresponding device (external device) such as a battery or an electrical component with a connector interposed therebetween, for example.

The electrical connection box 1 is sometimes called a junction box, a fuse box, or a relay box, for example, in accordance with a type of the electronic components accommodated therein. In the embodiment, those boxes are collectively called the "electrical connection box".

Figure 12:
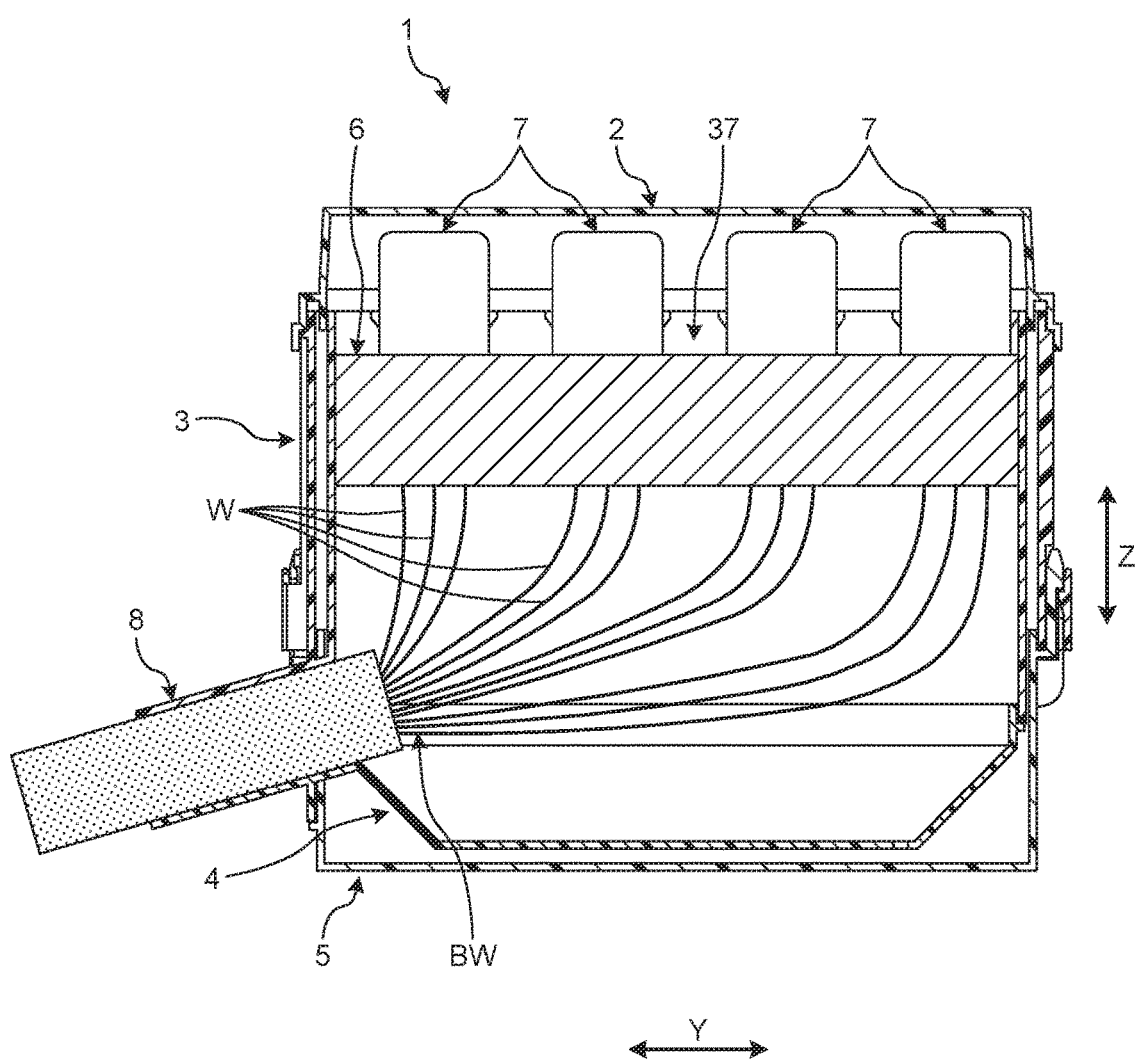
FIG. 12 is a cross-sectional view of the electrical connection box housing electronic components.

The electrical connection box 1 in the embodiment is mounted on a vehicle 100 as illustrated in FIG. 3, for example. The electrical connection box 1 is disposed in an engine compartment provided in a front portion of the vehicle 100, for example. As illustrated in FIG. 12, the electrical connection box 1 accommodates a plurality of relays 7, for example. The electrical connection box 1 in the embodiment is interposed between a power source such as a battery and the electrical components. The electrical connection box 1 controls electric power supplied from the power source to the electrical components.

The electrical connection box 1 in the embodiment has a rectangular parallelepiped shape. As illustrated in FIGS. 1 and 2, the electrical connection box 1 includes a cylindrical portion 8 that protrudes outward. Through the cylindrical portion 8, an internal space and an external space of the electrical connection box 1 communicate with each other. The multiple electrical wires W are inserted into and passed through the cylindrical portion 8. One end of the electrical wire W is electrically connected to the relay 7 accommodated in the electrical connection box 1. The other end of the electrical wire W is electrically connected to the power source or the electrical component, for example. The electrical wires W are covered wires each having a core wire covered with an insulating cover.

As illustrated in FIGS. 4 and 5, the frame 3 includes a tubular inner wall 31, a tubular outer wall 32, and a first half-cylindrical portion 33. The inner wall 31, the outer wall 32, and the first half-cylindrical portion 33 are integrally formed of an insulating synthetic resin, for example. Each of the inner wall 31 and the outer wall 32 is a structural portion having a tubular shape both ends of which in an axial direction Z are open. The cross-sectional shape of each of the inner wall 31 and the outer wall 32 is a rectangle. Each of the inner wall 31 and the outer wall 32 in the embodiment has a rectangular tubular structural portion.

The outer wall 32 surrounds the inner wall 31 and forms double walls together with the inner wall 31. The outer wall 32 is disposed at an interval between itself and an outer surface of the inner wall 31. In other words, an inner surface of the outer wall 32 and the outer surface of the inner wall 31 face each other with a space therebetween. The upper edge of the inner wall 31 is positioned at the same height as the upper edge of the outer wall 32. A lower edge 31e of the inner wall 31 projects downward into a point below a lower edge 32e of the outer wall 32. A projecting portion 32d of the outer wall 32 projects to the position at the same height as the lower edge 31e of the inner wall 31.

The first half-cylindrical portion 33 is a structural portion having a half-cylindrical shape. The first half-cylindrical portion 33 is connected to both the inner wall 31 and the outer wall 32. The base end of the first half-cylindrical portion 33 is connected to the inner wall 31. The first half-cylindrical portion 33 projects from the outer wall 32 in such a manner that the distal portion of the first half-cylindrical portion 33 faces the outside of the outer wall 32. The first half-cylindrical portion 33 is tilted in such a manner that as it goes to the distal portion thereof, it goes downward.

The outer wall 32 includes a front wall 32a, a rear wall 32b, and a pair of sidewalls 32c, 32c. The front wall 32a and the rear wall 32b face each other. The pair of sidewalls 32c, 32c face each other. In the specification, the direction in which the sidewalls 32c, 32c face each other is described as a "width direction X" while the direction in which the front wall 32a and the rear wall 32b face each other is described as a "length direction Y". The width direction X and the length direction Y are orthogonal to each other. Each of the width direction X and the length direction Y is orthogonal to the axial direction Z of the frame 3. Each of the pair of sidewalls 32c, 32c connects the corresponding end portion of the front wall 32a and the corresponding end portion of the rear wall 32b in the length direction Y. The electrical connection box 1 in the embodiment is mounted on the vehicle 100 such that the front wall 32a and the rear wall 32b face each other in a front-rear direction of the vehicle 100, for example. The electrical connection box 1 in the embodiment is mounted on the vehicle 100 such that the front wall 32a is directed toward the front side of the vehicle 100, for example.

The front wall 32a has the projecting portion 32d which projects downward. The outer circumferential surface of the first half-cylindrical portion 33 is connected to the projecting portion 32d. The projecting portion 32d is formed in such a tapered shape that the length of the projecting portion 32d in the width direction X is reduced as it goes downward in the axial direction Z of the frame 3.

The lower portion of the outer wall 32 is provided with a plurality of first locking portions 34. The first locking portions 34 each lock one of locked portions 54 provided on the lower cover 5. Each first locking portion 34 has an insertion path portion into which the locked portion 54 is inserted and through which the locked portion 54 is passed, and a locking surface that locks a projection of the locked portion 54. The first locking portions 34 are respectively provided on each of the walls 32a and 32b and sidewalls 32c, 32c of the outer wall 32. On the front wall 32a, the first locking portions 34 are provided one each at both sides of the projecting portion 32d.

The upper portion of the outer wall 32 is provided with a plurality of second locking portions 35. The second locking portions 35 each lock one of multiple locked portions 21 provided on the upper cover 2. Each second locking portion 35 has an insertion portion into which the locked portion 21 is inserted and a locking surface that locks a projection of the locked portion 21. The second locking portions 35 are provided one each on each of the sidewalls 32c, 32c.

The inner wall 31 includes a front wall 31a, a rear wall 31b, and a pair of sidewalls 31c, 31c. The front wall 31a and the rear wall 31b face each other in the length direction Y. The pair of sidewalls 31c, 31c face each other in the width direction X. Each of the pair of sidewalls 31c, 31c is connected to the corresponding end portion of the front wall 31a and the corresponding end portion of the rear wall 31b in the length direction Y. The front wall 31a faces the front wall 32a of the outer wall 32. The rear wall 31b faces the rear wall 32b of the outer wall 32. The sidewalls 31c, 31c each face one of the sidewalls 32c, 32c of the outer wall 32.

The lower portion of the inner wall 31 is provided with a plurality of third locking portions 36. The third locking portions 36 each lock one of locked portions 46 provided on the inner cover 4. Each third locking portion 36 has an insertion path portion into which the locked portion 46 is inserted and through which the locked portion 46 is passed, and a locking surface that locks a projection of the locked portion 46. The third locking portions 36 are provided one each on each of the sidewalls 31c, 31c.

The upper cover 2 is a lid-shaped member that covers the upper edge of the frame 3. The upper cover 2 is provided with the multiple locked portions 21. The locked portions 21 are locked by the second locking portions 35 provided on the frame 3. As a result, the upper cover 2 is fixed to the frame 3.

The inner cover 4 is a covering member that covers the lower edge 31e of the inner wall 31. As illustrated in FIGS. 4, 6, and 7, the inner cover 4 includes a main body 41 and a second half-cylindrical portion 42. The main body 41 and the second half-cylindrical portion 42 are integrally formed of an insulating synthetic resin, for example. The main body 41, which is a main portion of the inner cover 4, covers the lower edge 31e of the inner wall 31. The main body 41 includes a bottom wall 43, a tilted wall 44, and a vertical wall 45.

The bottom wall 43 faces an opening provided in the lower side of the frame 3. The bottom wall 43 is orthogonal to the axial direction Z, for example. The tilted wall 44 is a tubular structural portion the cross-sectional shape of which is rectangle. The cross-sectional shape of the tilted wall 44 changes along the axial direction Z of the frame 3. The tilted wall 44 includes a front wall 44a, a rear wall 44b, and a pair of sidewalls 44c, 44c. Each of the pair of sidewalls 44c, 44c is connected to the corresponding end portion of the front wall 44a and the corresponding end portion of the rear wall 44b in the length direction Y. In the tilted wall 44 in the embodiment, each of the walls 44a and 44b, and sidewalls 44c is tilted with respect to the axial direction Z. The cross-sectional area of the tilted wall 44 is reduced as the tilted wall 44 goes to the bottom wall 43 side in the axial direction Z of the frame 3. The cross-sectional area of the tilted wall 44 is reduced as the tilted wall 44 goes downward in the up-down direction of the vehicle 100. The lower edge of the tilted wall 44 is covered by the bottom wall 43. The bottom wall 43 is provided with a through hole 43a. The through hole 43a is provided in the central portion in the width direction X and close to the rear wall 44b on the bottom wall 43. Water remaining on the bottom wall 43 is drained through the through hole 43a.

The vertical wall 45 projects upward from the upper edge of the tilted wall 44. The vertical wall 45 is in parallel with the axial direction Z of the frame 3. The vertical wall 45 is a tubular structural portion the cross-sectional shape of which is rectangle. The vertical wall 45 includes a front wall 45a, a rear wall 45b, and a pair of sidewalls 45c, 45c. The front wall 44a and the rear wall 44b correspond to the front wall 31a and the rear wall 31b of the inner wall 31, respectively. The sidewalls 45c, 45c each correspond to one of the sidewalls 31c, 31c of the inner wall 31. Each of the pair of sidewalls 45c, 45c is connected to the corresponding end portion of the front wall 45a and the corresponding end portion of the rear wall 45b in the length direction Y.

The external surface of the vertical wall 45 has a rib 48 formed thereon. The rib 48 in the embodiment is a line-shaped projection. The rib 48 extends over substantially the whole circumference of the vertical wall 45 such that the rib 48 surrounds the vertical wall 45. Each of both ends of the rib 48 is connected to the second half-cylindrical portion 42. More specifically, one end 48a of the rib 48 is connected to one end of the second half-cylindrical portion 42 in the width direction X. The other end 48b of the rib 48 is connected to the other end of the second half-cylindrical portion 42 in the width direction X. The one end 48a and the other end 48b of the rib 48 are connected to the upper end of the second half-cylindrical portion 42. The rib 48 continues from the one end 48a to the other end 48b via the front wall 45a, the one sidewall 45c, the rear wall 45b, and the other sidewall 45c.

The vertical wall 45 is provided with a plurality of locked portion 46. Each locked portion 46 is connected to the distal surface of the rib 48 and projects upward from the rib 48. The locked portions 46 are provided one each on each of the sidewalls 45c, 45c. The locked portions 46 are locked by the third locking portions 36 provided on the frame 3. As a result, the inner cover 4 is fixed to the frame 3.

The second half-cylindrical portion 42 is a structural portion having a half-cylindrical shape. The second half-cylindrical portion 42 is connected to the front wall 45a of the vertical wall 45 and the front wall 44a of the tilted wall 44. The second half-cylindrical portion 42 projects outward from outer surfaces of the front walls 44a and 45a. The second half-cylindrical portion 42 is tilted in such a manner that as it goes to the distal portion thereof, it goes downward. The second half-cylindrical portion 42 is provided with a plate portion 47. The plate portion 47 projects downward from the outer circumferential surface of the second half-cylindrical portion 42. The plate portion 47, which is a plate-shaped structural portion, is formed in such a tapered shape that the length of the plate portion 47 in the width direction X is reduced as it goes downward. The plate portion 47 is disposed at such a position that the plate portion 47 abuts the lower edge of the projecting portion 32d of the frame 3.

The lower cover 5 is a tubular member having a bottom. As illustrated in FIGS. 4 and 8, the lower cover 5 includes a bottom wall 51 and a sidewall 52. The sidewall 52 is a tubular structural portion. The cross-sectional shape of the sidewall 52 in the embodiment is rectangle. The sidewall 52 includes a front wall 52a, a rear wall 52b, and a pair of sidewalls 52c, 52c. The front wall 52a and the rear wall 52b face each other in the length direction Y. The pair of sidewalls 52c, 52c face each other in the width direction X. Each of the pair of sidewalls 52c, 52c is connected to the corresponding end portion of the front wall 52a and the corresponding end portion of the rear wall 52b in the length direction Y. The front wall 52a corresponds to the front wall 32a of the outer wall 32. The rear wall 52b corresponds to the rear wall 32b of the outer wall 32. The sidewalls 52c, 52c each face one of the sidewalls 32c, 32c of the outer wall 32.

The front wall 52a has a notch 53. The notch 53 is positioned on the upper portion and the central portion in the width direction X on the front wall 52a. The notch 53 includes a lower side notch 53a and an upper side notch 53b. The lower side notch 53a corresponds to the second half-cylindrical portion 42 of the inner cover 4. The lower side notch 53a has a semicircle shape. The upper side notch 53b corresponds to the projecting portion 32d of the frame 3. The upper side notch 53b has a trapezoidal shape. The length of the upper side notch 53b in the width direction X is reduced as it goes downward.

The external surface of the sidewall 52 has a rib 55 formed thereon such that the rib 55 projects in a direction orthogonal to the axial direction Z of the frame 3. The rib 55 is formed over the whole circumference of the external surface of the sidewall 52. The rib 55 traverses the front wall 52a, the one sidewall 52c, the rear wall 52b, and the other sidewall 52c to surround the external surface of the sidewall 52. The rib 55 linearly extends on the rear wall 52b, and the pair of sidewalls 52c, 52c.

The rib 55 is bent at the front wall 52a following the shape of the notch 53. More specifically, the rib 55 formed on the front wall 52a is composed of a pair of first tilted portions 55a, 55a, a first step portion 55b, a pair of second tilted portions 55c, 55c, and a second step portion 55d. Each of the first tilted portions 55a, 55a and the second tilted portions 55c, 55c is tilted with respect to the axial direction Z of the frame 3. The pair of tilted portions 55a, 55a and the pair of tilted portions 55c, 55c are tilted such that the tilted portions in the pair approach each other as they go downward. The first step 55b connects the lower end of the first tilted portion 55a and the upper end of the second tilted portion 55c. The second step portion 55d connects both lower ends of the pair of second tilted portions 55c, 55c.

The shapes of the first tilted portion 55a and the first step portion 55b correspond to the shape of the projecting portion 32d of the frame 3. The first tilted portion 55a and the first step portion 55b can support the projecting portion 32d from below. The shapes of the second tilted portion 55c and the second step portion 55d correspond to the shape of the plate portion 47 of the inner cover 4. The second tilted portion 55c and the second step portion 55d can support the plate portion 47 from below.

The upper portion of the sidewall 52 is provided with a plurality of locked portions 54. The locked portions 54 are provided one each on each of the walls 52a, 52b and sidewalls 52c, 52c. On the front wall 52a, the locked portions 54 are provided one each at both sides of the notch 53. The locked portions 54 are locked by the first locking portions 34 provided on the frame 3. As a result, the lower cover 5 is fixed to the frame 3.

The bottom wall 51 covers the lower end portion of the sidewall 52. The bottom wall 51 is provided with a through hole 51a. The through hole 51a is formed at the central portion in the width direction X and close to the rear wall 52b on the bottom wall 51. Water entered inside the lower cover 5 drains through the through hole 51a.

Figure 9:
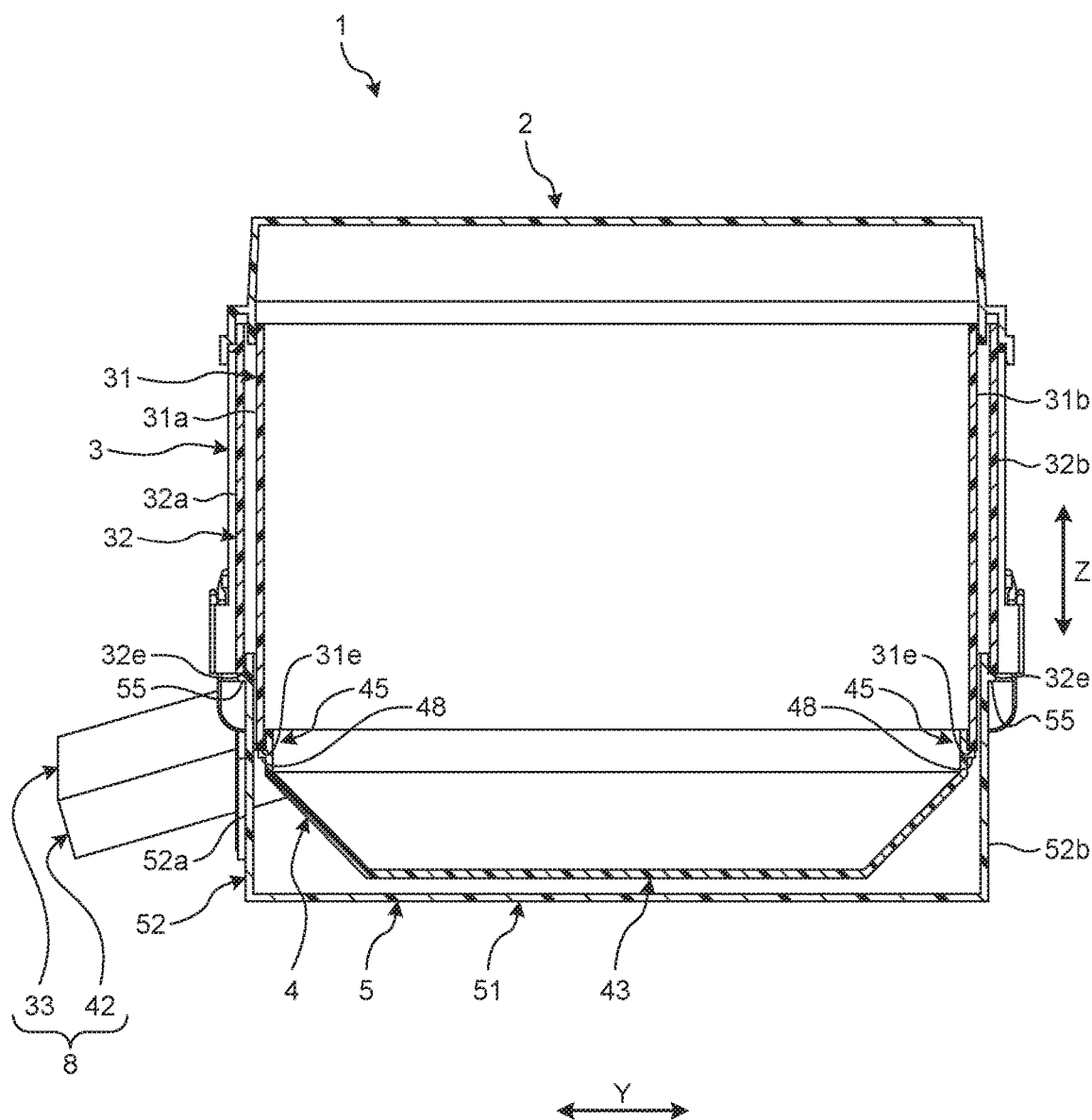
FIG. 9 is a cross-sectional view of the electrical connection box according to the embodiment.

FIG. 9 is a cross-sectional view along line IX-IX of FIG. 2. As illustrated in FIG. 9, the sidewall 52 of the lower cover 5 is inserted between the outer wall 32 and the inner wall 31 of the frame 3. For example, the front wall 52a of the sidewall 52 is inserted between the front wall 32a of the outer wall 32 and the front wall 31a of the inner wall 31. The rear wall 52b of the sidewall 52 is inserted between the rear wall 32b of the outer wall 32 and the rear wall 31b of the inner wall 31. The rib 55 of the lower cover 5 abuts the lower edge 32e of the outer wall 32. The lower cover 5, thus, covers the lower edge 32e of the outer wall 32 by the rib 55, the sidewall 52, and the bottom wall 51. The insertion of the sidewall 52 between the double walls composed of the inner wall 31 and the external wall 32 makes it possible to restrict invasion of water from a gap between the frame 3 and the lower cover 5. In addition, the rib 55 abutting the lower edge 32e of the external wall 32 makes it hard to form a gap between the frame 3 and the lower cover 5.

The vertical wall 45 of the inner cover 4 is inserted into the inner wall 31 and fitted with the inner wall 31. The rib 48 abuts the lower edge 31e of the inner wall 31. The lower cover 4, thus, covers the lower edge 31e of the inner wall 31 by the rib 48, the vertical wall 45, the tilted wall 44, and the bottom wall 43.

As illustrated in FIG. 9, the cylindrical portion 8 is formed by the first half-cylindrical portion 33 and the second half-cylindrical portion 42. When the main body 41 of the inner cover 4 covers the lower edge 31e of the inner wall 31, the second half-cylindrical portion 42 abuts the first half-cylindrical portion 33. As a result of the second half-cylindrical portion 42 abutting the first half-cylindrical portion 33, the cylindrical portion 8 having a cylindrical shape is formed.

Figure 10:
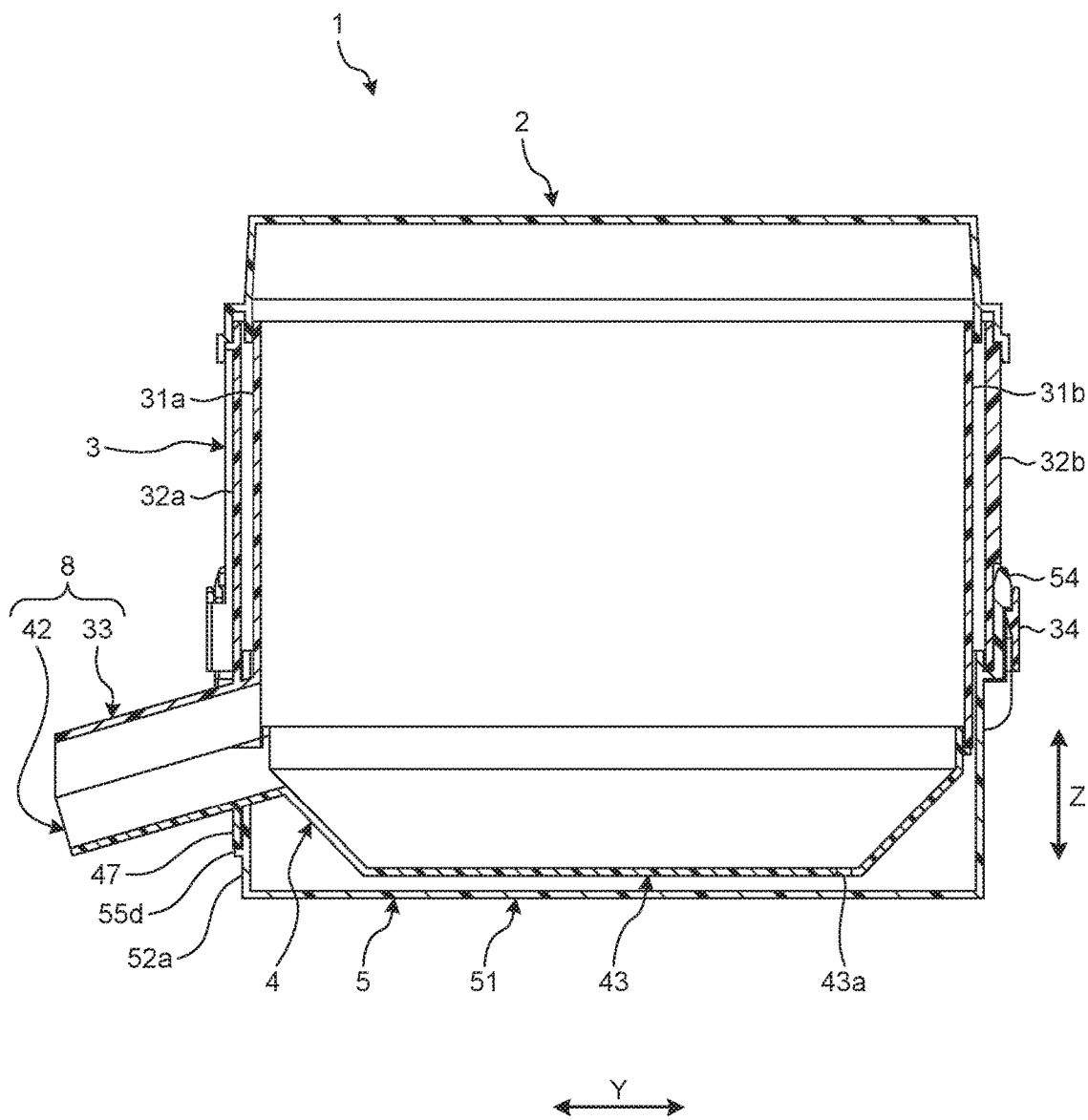
FIG. 10 is another cross-sectional view of the electrical connection box according to the embodiment.
Figure 11:
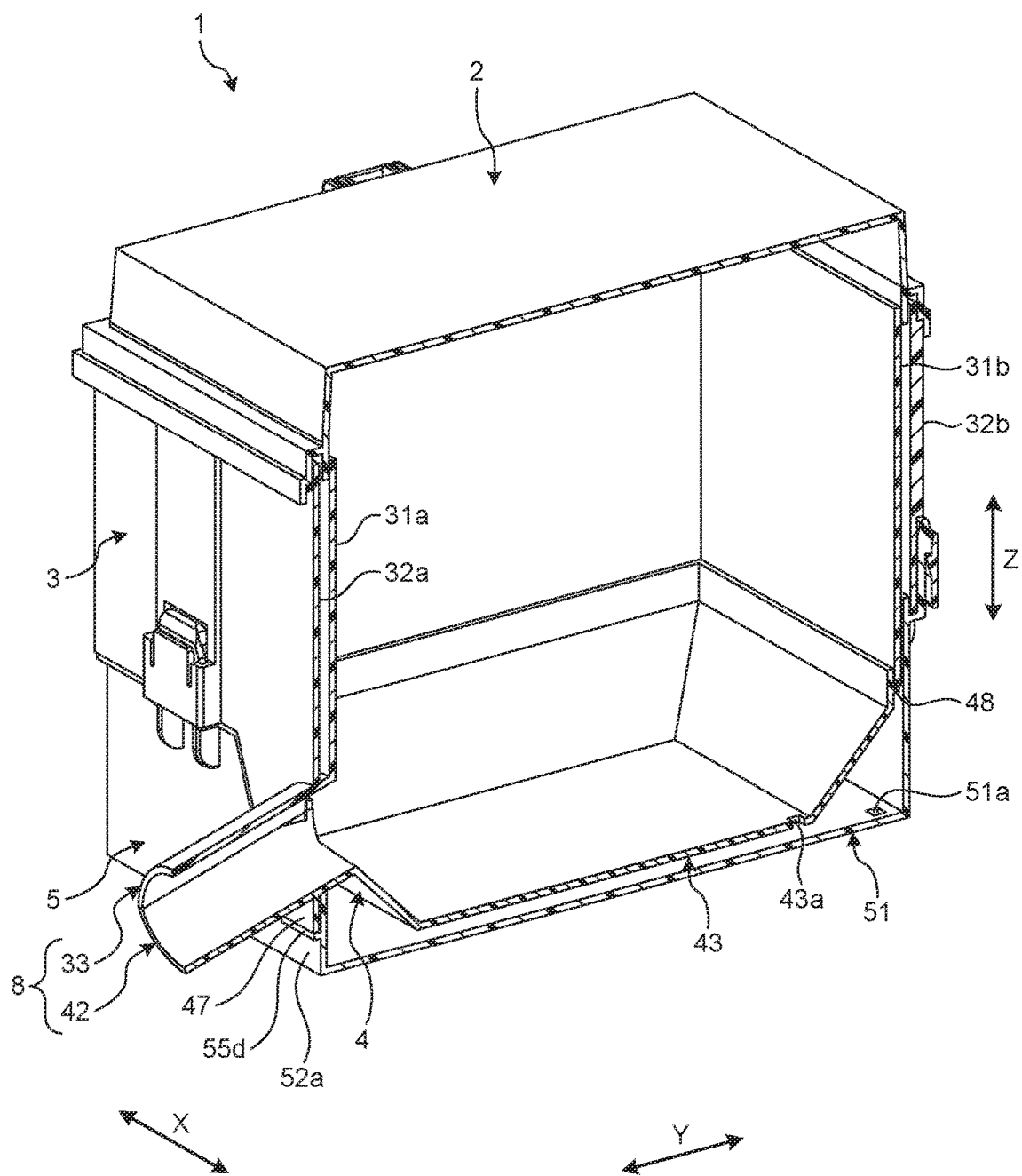
FIG. 11 is a perspective cross-sectional view of the electrical connection box according to the embodiment.

FIG. 10 is a cross-sectional view taken along line X-X of FIG. 2. FIG. 11 is a perspective view of the cross section. As illustrated in FIGS. 10 and 11, a space inside the inner wall 31 and a space outside the electrical connection box 1 communicate with each other through the cylindrical portion 8. The plate portion 47 of the inner cover 4 is supported by the second step portion 55d of the lower cover 5. The plate portion 47 faces the front wall 52a of the lower cover 5. A gap between the plate portion 47 and the front wall 52a is so sufficiently narrow that invasion of water from the outside can be reduced.

As illustrated in FIG. 12, the electronic components are accommodated inside the frame 3. The frame 3 in the embodiment houses the relays 7 serving as the electronic components. The relays 7 are accommodated in an accommodation space 37 inside the inner wall 31. Parts of the relays 7 may project from the accommodation space 37 to the upper cover 2 side. The relays 7 are held by a block 6, for example. The block 6, which is a member formed of an insulating synthesis resin, is held by the frame 3. The relays 7 are inserted into the block 6 from above and engaged with the block 6, for example.

To respective terminals of the relays 7, the electrical wires W are electrically connected. The electrical wires W are pulled out downward from the block 6. The multiple electrical wires W are bundled in an electrical wire bundle BW, and inserted into and passed through the cylindrical portion 8. The electrical wire bundle BW may be covered with an external member such as a corrugated tube. A gap between the electrical wire bundle BW and the inner circumferential surface of the cylindrical portion 8 is filled with a sealing material, for example. When the electrical wire bundle BW is covered with an external member, a gap between the external member and the cylindrical portion 8 is filled with a sealing material. The sealing material filled in the gap prevents water from entering the inside of the electrical connection box 1 through the cylindrical portion 8.

Figure 13:
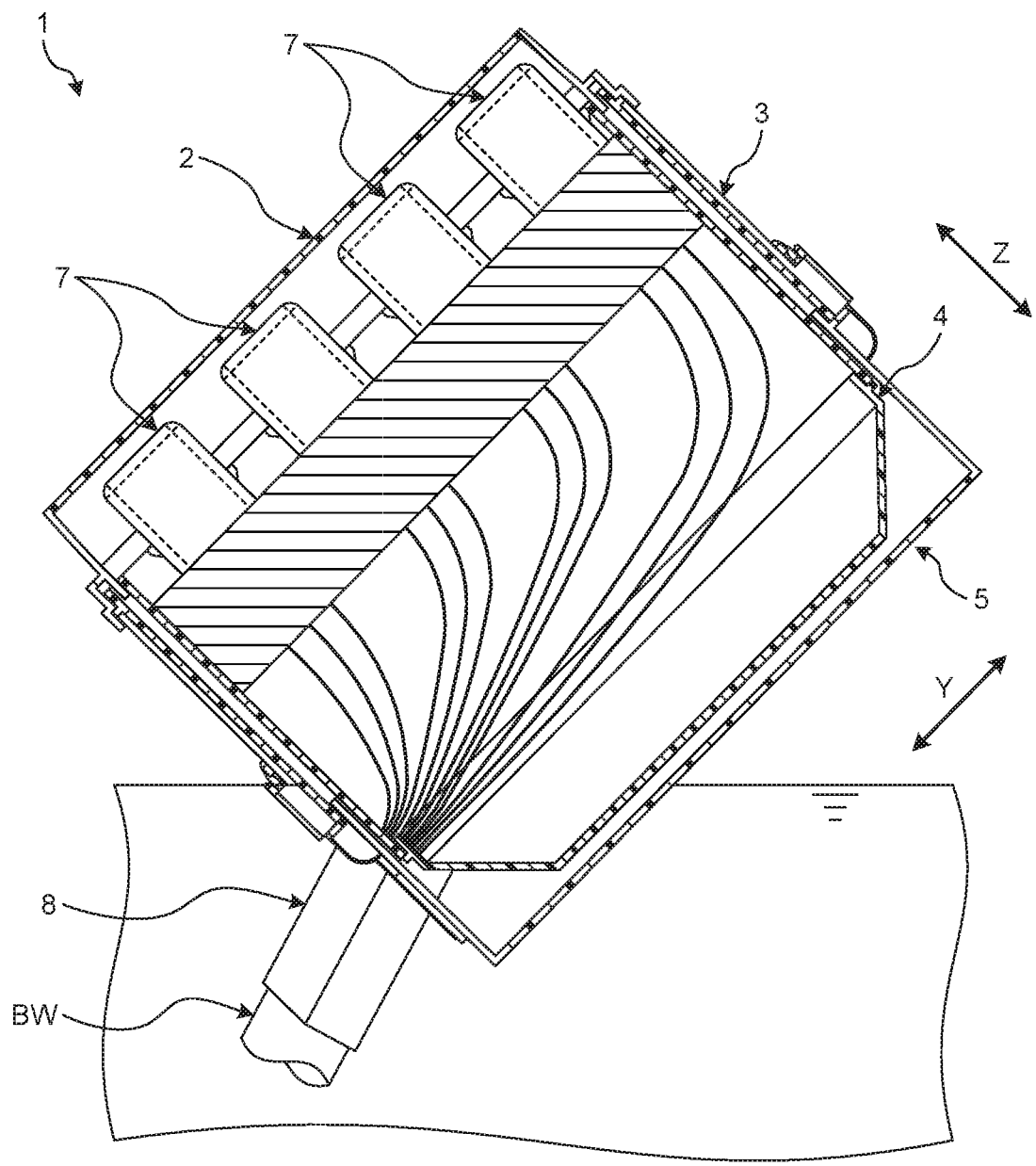
FIG. 13 is a cross-sectional view of the electrical connection box submerged in water.

As described below, in the electrical connection box 1 in the embodiment, the electronic components have less influence of water invasion when water enters the inside of the electrical connection box 1 from the lower portion of the electrical connection box 1. A case where the vehicle 100 travels across a river is an example of cases where water enters the inside of the electrical connection box 1. When the vehicle 100 enters water as illustrated in FIG. 3, the electrical connection box 1 is temporarily submerged in water in some cases as illustrated in FIG. 13. As a result, there is a possibility that water enters the inside of the electrical connection box 1. For example, a case is assumed where water enters the inside of the electrical connection box 1 from a gap between the frame 3 and lower cover 5.

Figure 14:
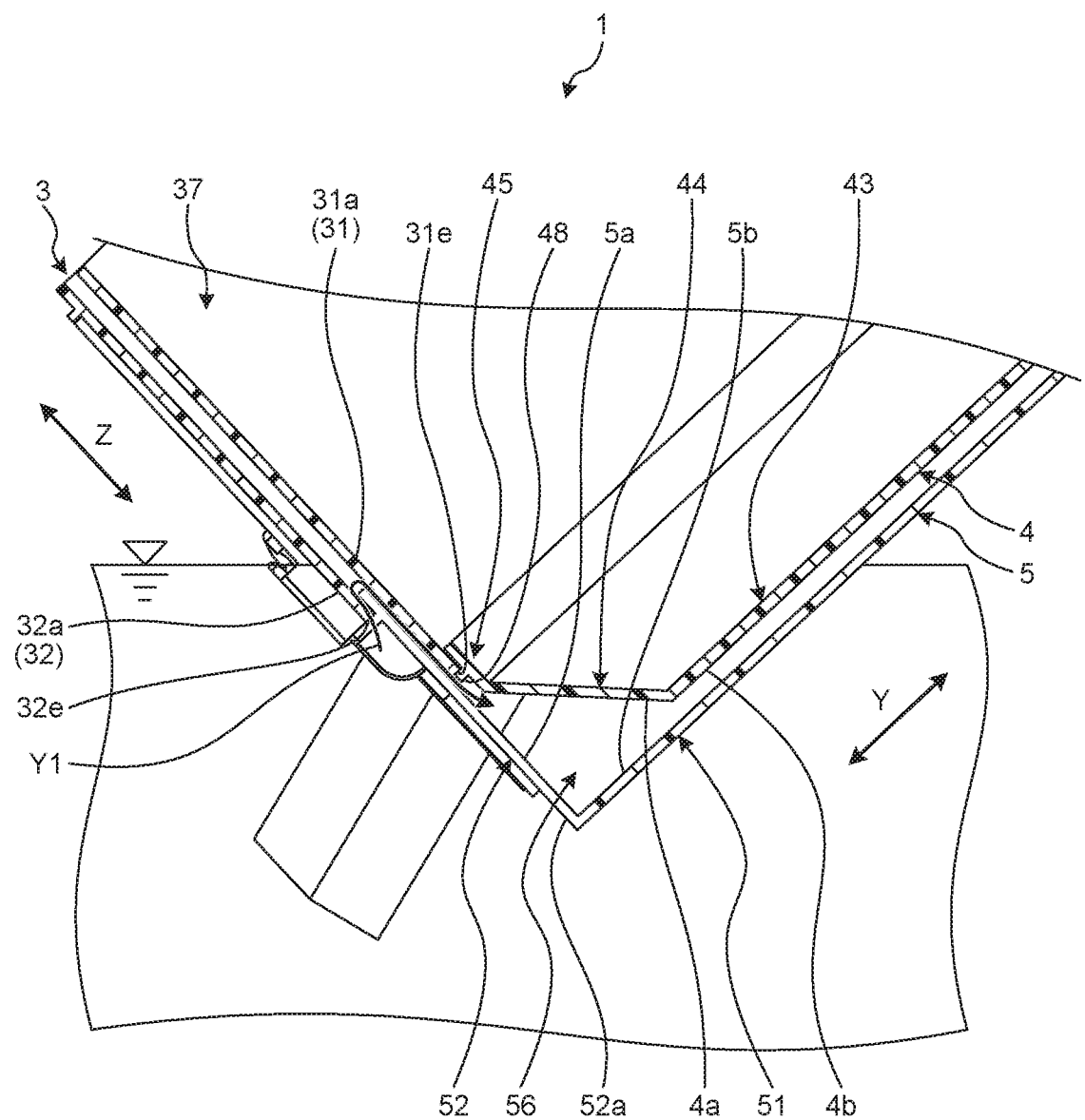
FIG. 14 is a cross-sectional view illustrating a path of water entering the inside of the electrical connection box.

The electrical connection box 1 in the embodiment guides water entering the inside of the electrical connection box 1 to a water storage 56 as illustrated with arrow Y1 in FIG. 14. The water storage 56 is a space between the inner cover 4 and the lower cover 5. More specifically, the water storage 56 is the space defined by the sidewall 52 and the bottom wall 51 of the lower cover 5, and the tilted wall 44 and the bottom wall 43 of the inner cover 4. In the electrical connection box 1 in the embodiment, an outer surface 4a of the inner cover 4 is apart from an inner surface 5a of the lower cover 5 while an outer surface 4b of the inner cover 4 is apart from an inner surface 5b of the lower cover 5. The outer surface 4a is the outer surface of the tilted wall 44 while the outer surface 4b is the outer surface of the bottom wall 43. The inner surface 5a is the inner surface of the sidewall 52 while the inner surface 5b is the inner surface of the bottom wall 51. In a state where the inner cover 4 and the lower cover 5 are assembled to the frame 3, the outer surface 4a is apart from the inner surface 5a and the outer surface 4b is apart from the inner surface 5b. As a result, the water storage 56 capable of storing entered water is formed between the inner cover 4 and the lower cover 5.

When water enters the inside of the electrical connection box 1 from a gap between the sidewall 52 of the lower cover 5 and the outer wall 32 of the frame 3, water is guided to the water storage 56 after passing through a gap between the sidewall 52 and the inner wall 31. Water flows in the water storage 56 along the inner surface 5a of the sidewall 52. In the electrical connection box 1 in the embodiment, the inner wall 31 extends downward to a point lower than the outer wall 32. In other words, a range in which the inner wall 31 and the sidewall 52 face each other is long in the axial direction Z of the frame 3. As a result, force of entered water is reduced, thereby causing splashes to hardly occur.

In the electrical connection box 1 in the embodiment, the inner cover 4 covers the lower edge 31e of the inner wall 31. The inner cover 4 separates the accommodation space 37 accommodating the electronic components and the water storage 56. The inner cover 4 prevents water in the water storage 56 from entering the accommodation space 37 disposed inside the inner wall 31. Even when splashes of water occur in the water storage 56 due to a vibration of the vehicle 100, for example, the inner cover 4 blocks the splashes. As a result, the electronic components are prevented from being splashed with water. The vertical wall 45 of the inner cover 4 is inserted into the inner wall 31 and fitted with the inner wall 31. This structure causes water entered a gap between the inner wall 31 and the sidewall 52 to hardly enter a gap between the inner cover 4 and the inner wall 31.

In the electrical connection box 1 in the embodiment, a size of the gap between the outer surface 4a of the inner cover 4 and the inner surface 5a of the lower cover 5 is increased in the direction toward the bottom wall 51 of the lower cover 5. The inner cover 4 in the embodiment includes the tilted wall 44. A size of the gap between the outer surface 4a of the tilted wall 44 and the inner surface 5a of the sidewall 52 is increased as going to the bottom wall 51 in the axial direction Z of the frame 3. The electrical connection box 1 in the embodiment, thus, can achieve the water storage 56 having a sufficient capacity and prevent the accommodation space 37 accommodating the electronic components from water invasion.

In the electrical connection box 1 in the embodiment, the rib 48 of the inner cover 4 abuts the lower edge 31e of the inner wall 31. When a water level in the water storage 56 is increased to reach the outer surfaces 4a and 4b of the inner cover 4, buoyancy acts on the inner cover 4. The buoyancy pushes the rib 48 to the lower edge 31e of the inner wall 31 and is closely contact with the lower edge 31e, thereby preventing invasion of water inside the inner wall 31.

As described above, the electrical connection box 1 in the embodiment includes the frame 3, the lower cover 5, and the inner cover 4. The frame 3 includes the tubular inner wall 31 and the tubular outer wall 32 surrounding the inner wall 31, and accommodates the electronic components inside the inner wall 31. The lower cover 5 covers the lower edge 32e of the outer wall 32. The inner cover 4 is disposed inside the lower cover 5 and covers the lower edge 31e of the inner wall 31. The electrical connection box 1 in the embodiment includes the inner cover 4 that covers the lower edge 31e of the inner wall 31, thereby making it possible to protect the electronic components from water entered the lower portion of the electrical connection box 1.

In the electrical connection box 1 in the embodiment, the outer surface 4a of the inner cover 4 is apart from the inner surface 5a of the lower cover 5 while the outer surface 4b of the inner cover 4 is apart from the inner surface 5b of the lower cover 5. As a result, the water storage 56 is formed between the inner cover 4 and the lower cover 5. The water storage 56 stores therein water entered inside the electrical connection box 1, thereby making it possible to protect the electronic components from water.

In the electrical connection box 1 in the embodiment, a size of the gap between the outer surface 4a of the inner cover 4 and the inner surface 5a of the lower cover 5 is increased in the direction toward the bottom wall 51 of the lower cover 5. The electrical connection box 1 in the embodiment can achieve the water storage 56 having a sufficient capacity.

The frame 3 in the embodiment includes the first half-cylindrical portion 33 having a half-cylindrical shape. The first half-cylindrical portion 33 is formed integrally with the inner wall 31 and the outer wall 32, and projects outward from the outer wall 32. The inner cover 4 includes the main body 41 and the second half-cylindrical portion 42 having a half-cylindrical shape. The main body 41 covers the lower edge 31e of the inner wall 31. The second half-cylindrical portion 42 projects outward from the main body 41. In a state where the main body 41 covers the lower edge 31e of the inner wall 31, the cylindrical portion 8 is formed by the first half-cylindrical portion 33 and the second half-cylindrical portion 42. The electrical wires W connected to the electronic components are inserted into and passed through the cylindrical portion 8. As a result of the formation of the cylindrical portion 8 by the first half-cylindrical portion 33 of the frame 3 and the second half-cylindrical portion 42 of the inner cover 4, the lower cover 5 serves as the member separated from the cylindrical portion 8. As a result, this structure allows water entering the inside of the electrical connection box 1 from a portion near the cylindrical portion 8 to be easily guided to the water storage 56. When a gap between the electrical wires W and the cylindrical portion 8 is filled with a sealing material, the accommodation space 37 accommodating the electronic components can be effectively prevented from water invasion.

In the electrical connection box 1 in the embodiment, the main body 41 of the inner cover 4 has the rib 48 formed on the outer surface of the main body 41. The rib 48 is a line-shaped projection and abuts the lower edge 31e of the inner wall 31. The rib 48 is connected to the second half-cylindrical portion 42. The inner cover 4, thus, can form the cylindrical portion 8 while the rib 48 covers the lower edge 31e of the inner wall 31.

In the electrical connection box 1 in the embodiment, the sidewall 52 of the lower cover 5 is inserted between the outer wall 32 and the inner wall 31 of the frame 3. As a result of inserting the sidewall 52 between the outer wall 32 and the inner wall 31, a parting position between the lower cover 5 and the frame 3 becomes a high level. Because the parting position has a high level, water hardly enters the inside of the electrical connection box 1 even when a water level outside the electrical connection box 1 is the same as the parting position.

Modifications of the Embodiment

The following describes modifications of the embodiment. The respective shapes of the frame 3, the inner cover 4, and the lower cover 5 are not limited to those exemplified above. For example, in the inner cover 4, the shape of the portion that covers the lower edge 31e of the inner wall 31 and the covering method are not limited to those exemplified above. In the lower cover 5, the shape of the portion that covers the lower edge 32e of the outer wall 32 and the covering method are not limited to those exemplified above.

The electronic components accommodated in the accommodation space 37 are not limited to the relays 7. The electronic components may be other electronic components such as fuses. The accommodation space 37 may accommodate a plurality of kinds of electronic components.

The direction of the electrical connection box 1 when the electrical connection box 1 is mounted on the vehicle 100 is not limited to the direction exemplified above. For example, the electrical connection box 1 may be mounted such that the front wall 32a faces the rear of the vehicle 100, or the front wall 32a faces the side of the vehicle 100, or the front wall 32a faces other directions.

The contents disclosed in the embodiment and the modifications may be implemented by appropriately combining them.

The electrical connection box according to the present embodiment includes the frame that has a tubular inner wall and a tubular outer wall surrounding the inner wall, and houses the electronic components inside the inner wall, the lower cover that covers the lower edge of the outer wall, and the inner cover that is disposed inside the lower cover and covers the lower edge of the inner wall. In the electrical connection box according to the present embodiment, the lower edge of the inner wall is covered by the inner cover. The electrical connection box according to the present embodiment, thus, has an advantageous effect capable of protecting the electronic components from water entered from the lower portion of the electrical connection box.

Although the invention has been described with respect to the specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
a frame that includes a tubular inner wall, a tubular outer wall surrounding the inner wall, and an accommodation space inside the inner wall that accommodates an electronic component;
a lower cover that covers a lower edge of the outer wall; and
an inner cover that is disposed inside the lower cover and covers a lower edge of the inner wall, wherein the inner cover separates the accommodation space and the lower cover.

2. The electrical connection box according to claim 1, wherein an outer surface of the inner cover is apart from an inner surface of the lower cover.

3. The electrical connection box according to claim 2, wherein
a size of a gap between the outer surface of the inner cover and the inner surface of the lower cover is increased as going to a bottom wall of the lower cover.

4. The electrical connection box according to claim 3, wherein
the frame includes a first half-cylindrical portion that is formed integrally with the inner wall and the outer wall, has a half-cylindrical shape, and projects outward from the outer wall,
the inner cover includes a main body that covers the lower edge of the inner wall and a second half-cylindrical portion that has a half-cylindrical shape and projects outward from the main body,
a cylindrical portion is formed by the first half-cylindrical portion and the second half-cylindrical portion in a state where the main body covers the lower edge of the inner wall, and
an electrical wire connected to the electronic component is inserted into and passed through the cylindrical portion.

5. The electrical connection box according to claim 4, wherein
the main body has a line-shaped rib provided on an outer surface of the main body,
the rib abuts the lower edge of the inner wall, and
the rib is connected to the second half-cylindrical portion.

6. The electrical connection box according to claim 3, wherein
a sidewall of the lower cover is inserted between the outer wall and the inner wall.

7. The electrical connection box according to claim 2, wherein
the frame includes a first half-cylindrical portion that is formed integrally with the inner wall and the outer wall, has a half-cylindrical shape, and projects outward from the outer wall,
the inner cover includes a main body that covers the lower edge of the inner wall and a second half-cylindrical portion that has a half-cylindrical shape and projects outward from the main body,
a cylindrical portion is formed by the first half-cylindrical portion and the second half-cylindrical portion in a state where the main body covers the lower edge of the inner wall, and
an electrical wire connected to the electronic component is inserted into and passed through the cylindrical portion.

8. The electrical connection box according to claim 7, wherein
the main body has a line-shaped rib provided on an outer surface of the main body, the rib abuts the lower edge of the inner wall, and the rib is connected to the second half-cylindrical portion.

9. The electrical connection box according to claim 2, wherein a sidewall of the lower cover is inserted between the outer wall and the inner wall.

10. The electrical connection box according to claim 1, wherein the frame includes a first half-cylindrical portion that is formed integrally with the inner wall and the outer wall, has a half-cylindrical shape, and projects outward from the outer wall, the inner cover includes a main body that covers the lower edge of the inner wall and a second half-cylindrical portion that has a half-cylindrical shape and projects outward from the main body, a cylindrical portion is formed by the first half-cylindrical portion and the second half-cylindrical portion in a state where the main body covers the lower edge of the inner wall, and an electrical wire connected to the electronic component is inserted into and passed through the cylindrical portion.

11. The electrical connection box according to claim 10, wherein the main body has a line-shaped rib provided on an outer surface of the main body, the rib abuts the lower edge of the inner wall, and the rib is connected to the second half-cylindrical portion.

12. The electrical connection box according to claim 11, wherein a sidewall of the lower cover is inserted between the outer wall and the inner wall.

13. The electrical connection box according to claim 10, wherein a sidewall of the lower cover is inserted between the outer wall and the inner wall.

14. The electrical connection box according to claim 1, wherein a sidewall of the lower cover is inserted between the outer wall and the inner wall.

15. An electrical connection box comprising:

a frame that includes a tubular inner wall and a tubular outer wall surrounding the inner wall, and accommodates an electronic component inside the inner wall;

an upper cover that covers an upper portion of the frame;

a lower cover that covers a lower edge of the outer wall; and an inner cover that is disposed inside the lower cover and covers a lower edge of the inner wall, wherein an outer surface of the inner cover is apart from an inner surface of the lower cover.

16. The electrical connection box according to claim 15, wherein the frame includes an accommodation space inside the inner wall that accommodates the electronic component, and the inner cover separates the accommodation space and the lower cover.

\* \* \* \* \*